(12) United States Patent
Hara

(10) Patent No.: US 7,081,949 B2
(45) Date of Patent: Jul. 25, 2006

(54) ILLUMINATION APPARATUS, PROJECTION EXPOSURE APPARATUS, AND DEVICE FABRICATION METHOD

(75) Inventor: Shinichi Hara, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 104 days.

(21) Appl. No.: 10/766,258

(22) Filed: Jan. 27, 2004

(65) Prior Publication Data

US 2004/0227920 A1    Nov. 18, 2004

(30) Foreign Application Priority Data

Jan. 27, 2003   (JP) ............................. 2003-016961

(51) Int. Cl.
*G03B 27/72* (2006.01)
*G03B 27/42* (2006.01)

(52) U.S. Cl. .......................................... 355/71; 355/53
(58) Field of Classification Search ................. 355/53, 355/71, 67; 356/400, 401; 250/548; 430/30
See application file for complete search history.

(56) References Cited

U.S. PATENT DOCUMENTS

| | | | | |
|---|---|---|---|---|
| 3,775,008 A | * | 11/1973 | Schaeffer et al. | 355/18 |
| 4,503,335 A | * | 3/1985 | Takahashi | 250/548 |
| 4,564,284 A | * | 1/1986 | Tsutsui | 355/30 |
| 4,720,732 A | * | 1/1988 | Tsutsui | 355/30 |
| 5,905,565 A | * | 5/1999 | Itojima et al. | 355/30 |
| 6,313,567 B1 | | 11/2001 | Maltabes et al. | |
| 6,768,627 B1 | * | 7/2004 | Kitabayashi et al. | 361/234 |
| 6,919,951 B1 | * | 7/2005 | Tsuji | 355/53 |
| 2003/0218731 A1 | * | 11/2003 | Tomita | 355/53 |
| 2004/0227922 A1 | * | 11/2004 | Dierichs et al. | 355/71 |

FOREIGN PATENT DOCUMENTS

| | | |
|---|---|---|
| EP | 0 874 283 A2 | 10/1998 |
| EP | 1077393 A2 | 2/2001 |

(Continued)

OTHER PUBLICATIONS

Y. Miwa; abstract of Japanese application #0611 7684; filed May 6, 1994; published in G03B009/02, G03B027/00, G03B027/32, H01L021/027; on Nov. 14, 1995.*

(Continued)

*Primary Examiner*—W. B. Perkey
*Assistant Examiner*—Vivian Nelson
(74) *Attorney, Agent, or Firm*—Morgan & Finnegan, LLP

(57) ABSTRACT

An exposure apparatus having an exposure mode that transfers a pattern on a reticle onto an object, and a standby mode that waits for exposure includes an optical system for introducing the exposure light to the object in the exposure mode, and a mechanism for allowing the exposure light to enter the reticle and/or the optical system in the standby mode, and for preventing the exposure light from entering the object in the standby mode.

11 Claims, 7 Drawing Sheets

| | FOREIGN PATENT DOCUMENTS | |
|---|---|---|
| EP | 1 211 918 A1 | 6/2002 |
| EP | 1241706 A2 | 9/2002 |
| JP | 63-266821 | 11/1988 |
| JP | 5-291117 | 11/1993 |
| JP | 6-124871 | 5/1994 |
| JP | 407301845 A * | 11/1995 |
| JP | A10-041376 | 2/1998 |

OTHER PUBLICATIONS

"Partial European Search Report" of European Patent Application No. 04 00 1593; dated Nov. 25, 2005 (5 pages).

A Communication issued on Mar. 3, 2006 for Appl. No. 04001593.5-2222.

* cited by examiner

ILLUMINATION APPARATUS, PROJECTION EXPOSURE APPARATUS, AND DEVICE FABRICATION METHOD

This application claims a benefit of foreign priority based on Japanese Patent Application No. 2003-016961, filed on Jan. 27, 2003, which is hereby incorporated by reference herein in its entirety as if fully set forth herein.

BACKGROUND OF THE INVENTION

The present invention relates to an exposure apparatus, and more particularly to an exposure apparatus used to manufacture devices, such as a single crystal substrate for a semiconductor wafer and a glass plate for a liquid crystal display (LCD). The present invention is suitable, for example, for an exposure apparatus that uses as exposure light ultraviolet ("UV") light and extreme ultraviolet ("EUV") light.

There has conventionally been employed a reduction projection exposure apparatus that uses a projection optical system to project a circuit pattern on a mask (reticle) onto a wafer, etc. to transfer the circuit pattern, in manufacturing such a fine semiconductor device as a semiconductor memory and a logic circuit in the photolithography technology.

The minimum critical dimension to be transferred by the projection exposure apparatus or resolution is proportionate to a wavelength of light used for exposure, and inversely proportionate to the numerical aperture ("NA") of the projection optical system. The shorter the wavelength is, the better the resolution is. Recent demands for finer semiconductor devices have promoted a shorter wavelength of ultraviolet light from an ultra-high pressure mercury lamp (i-line with a wavelength of approximately 365 nm) to KrF excimer laser (with a wavelength of approximately 248 nm) and ArF excimer laser (with a wavelength of approximately 193 nm).

The lithography using the ultraviolet light has the limit to satisfy the imminent demands for finer semiconductor devices. Accordingly, a reduction projection exposure apparatus (referred to as an "EUV exposure apparatus" hereinafter) has been developed which uses EUV light with a wavelength of 10 to 15 nm shorter than that of the ultraviolet light to efficiently transfer a very fine circuit pattern of 0.1 μm or less.

As the exposure light has a shorter wavelength, its absorption remarkably increases in a material, and becomes incompatible with use a refraction element or lens for visible light and ultraviolet light. No glass material is compatible with a EUV light's wavelength, and a reflection-type or catadioptric optical system is used which utilizes only a reflective element or multilayer mirror. A reticule also uses a cataoptric reticle that uses an absorber on a mirror to form a pattern to be transferred.

The mirror cannot reflect all exposure light, but absorbs 30% or greater of the exposure light. The energy of most of the absorbed exposure light turns to residual heat and causes temperature rises of mirror and the reticle. The temperature rises even in a mirror holder that supports the mirror and a reticle chuck that absorbs the reticle due to the residual heat.

At the exposure time, the exposure light is guided to an illumination optical system, a reticle, a projection optical system, and a wafer in this order, and each component generates the heat as a result of absorption of the exposure light. In other words, the temperature rises in mirrors in the illumination and projection optical systems, in the reticle, and in the mirror holders and the reticle chuck due to heat transmissions from the mirrors and reticle. However, the temperature rise gradually mitigates through repetitive exposures and becomes almost constant at a steady temperature.

The EUV exposure apparatus is used for exposure of a circuit pattern of 0.1 μm or smaller, and requires mirrors (in particular, a reflective surface of a projection optical system's mirror) and a reticle to have highly precise surface shapes. A shape error budget a (rms value) is given in the Marechal's criterion as Equation 1 below, where λ is a wavelength of EUV light, and n is the number of mirrors in the projection optical system:

$$\sigma = \frac{\lambda}{28 \times \sqrt{n}} \quad (1)$$

For example, where the EVU light has a wavelength of 13 nm and the projection optical system uses four mirrors, the shape error budget a becomes 0.23 nm. When the temperature rises in mirrors in the projection optical system as a result of exposure light absorptions, a deformed surface shape possibly exceeds the permissible shape error, and makes imaging performance insufficient, i.e., lowered resolution and contrast and insufficient transfers of fine patterns.

Accordingly, these mirrors and reticle use a low thermal expansion glass having a low coefficient of linear expansion, e.g., 10 ppb for reduced heat deformations of their shapes due to the temperature changes. Since the low thermal expansion glass has low rigidity and it is generally made thick to reduce deformations by external forces. This requires, however, an extremely long time for a temperature distribution to turn to a steady state.

The thermal strain amount varies while the temperature distribution turns greatly (to the steady state), and the mirrors and reticle vary their surface shapes, positions, etc., making the transfer accuracy too low for exposure, and reducing the throughput. In addition, a long standby time to exposure or long non-exposure time would decrease the temperatures of the mirrors and reticle, which have been at the steady state, and the exposure restart delays by several hours or longer for thermal stability.

Accordingly, there has been provided an exposure apparatus that provides means for heating a mirror other than the exposure light, makes constant the heat absorbed by the mirror, and maintains the thermal stability when the exposure light is shielded (see, for example, Japanese Patent Publication No. 5-291117).

However, it is difficult for heating means having a wavelength different from that of the exposure light to heat a mirror and reticle like the exposure time, because the mirror and reticle have different absorptive coefficients to optical energy according to light's wavelengths. Strict coincidence of the temperature rise with that at the exposure time requires one by one heating of a mirror, making the structure complicated and increasing the cost.

It is conceivable to repeat the same action between the exposure time and the standby time that waits for exposure. However, the standby time that iterates, similar to the exposure time, a procedure that includes the steps of introducing a wafer, fixing the wafer on the wafer chuck, irradiating the exposure light onto the wafer, and taking out the wafer, causes problems, such as arduous wafer carrying in and out, and worn contact parts in a wafer feeding system.

If a wafer chuck absorbs the wafer like the exposure time at the standby time, the wafer temperature rises and the wafer chuck temperature rises similarly through the wafer. Since the exposure time usually carries in the wafer one after another and carries it out after irradiating the exposure light to it, the wafer temperature does not rise greatly.

On the other hand, if the standby time maintains the wafer absorbed by the wafer chuck like the exposure time, the wafer chuck's temperature becomes higher than that at the actual exposure time. This means that the wafer chuck has different temperature distributions between the exposure time and the non-exposure time. Therefore, when the exposure starts form the standby time, the temperature of the wafer chuck that absorbs the wafer varies, deforms the wafer, and deteriorates the transfer precision.

BRIEF SUMMARY OF THE INVENTION

Accordingly, it is an exemplary object of the present invention to provide an exposure apparatus that almost equalizes temperature distributions of its element between the exposure time and the non-exposure time for maintained resolution and improved throughput.

An exposure apparatus of one aspect according to the present invention having an exposure mode that transfers a pattern on a reticle onto an object, and a standby mode that waits for exposure includes an optical system for introducing the exposure light to the object in the exposure mode, and a mechanism for allowing the exposure light to enter the reticle and/or the optical system in the standby mode, and for preventing the exposure light from entering the object in the standby mode. The exposure apparatus may further include a light source that emits the exposure light in the standby mode. The exposure light is, for example, extreme ultraviolet light having a wavelength of 20 nm or less.

The mechanism may include an absorption member that absorbs the exposure light, a drive mechanism for driving the absorption member between a first position on an optical path of the exposure light, and a second position apart from the optical path of the exposure light, and a controller for controlling driving by the drive mechanism so that the absorption member absorbs the exposure light in the standby mode. The exposure apparatus may further include a projection optical system for projecting the pattern onto the object, and wherein the first position is located between the projection optical system and the object.

The exposure apparatus may further include a stage for movably supporting the object, wherein the mechanism includes a drive mechanism for driving the stage to move the object to a position apart from an optical path of the exposure light. The mechanism may further include an absorption member that absorbs the exposure light, the absorption member being driven by the drive mechanism between a first position on an optical path of the exposure light, and a second position apart from the optical path of the exposure light, and a controller for controlling driving by the drive mechanism so that the absorption member absorbs the exposure light in the standby mode.

A chuck of another aspect according to the present invention fixes an object to be exposed, onto which a pattern on a reticle is exposed, and includes a contact part that contacts and fixes the objects, wherein a contact ratio of the contact part is 20% or smaller on a surface of object which contacts the contact part. An exposure apparatus having the above chuck also constitutes one aspect according to the present invention.

A standby method of still another aspect according to the present invention for waiting for exposure that transfers a pattern on a reticle onto an object absorbed by a wafer chuck through exposure light and an optical system includes the steps of irradiating the exposure light to the reticle and/or the optical system, and shielding the object from the exposure light during the irradiating step. An optical path of the light is maintained in an atmosphere under vacuum or reduced pressure.

An exposure method of another aspect according to the present invention that illuminates a pattern formed on a reticle and transfers the pattern onto an object absorbed by a wafer chuck through an optical system that includes an optical element includes the steps of determining whether temperatures of the reticle and/or the optical system are in steady states, and irradiating the exposure light onto the reticle and/or the optical system while preventing the exposure light from entering the object, when the determining step determines that the temperature distributions are not in the steady states.

A device fabricating method as still another aspect of the present invention includes the steps of exposing an object by using the above exposure apparatus, and developing the object exposed. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

Figure 1:
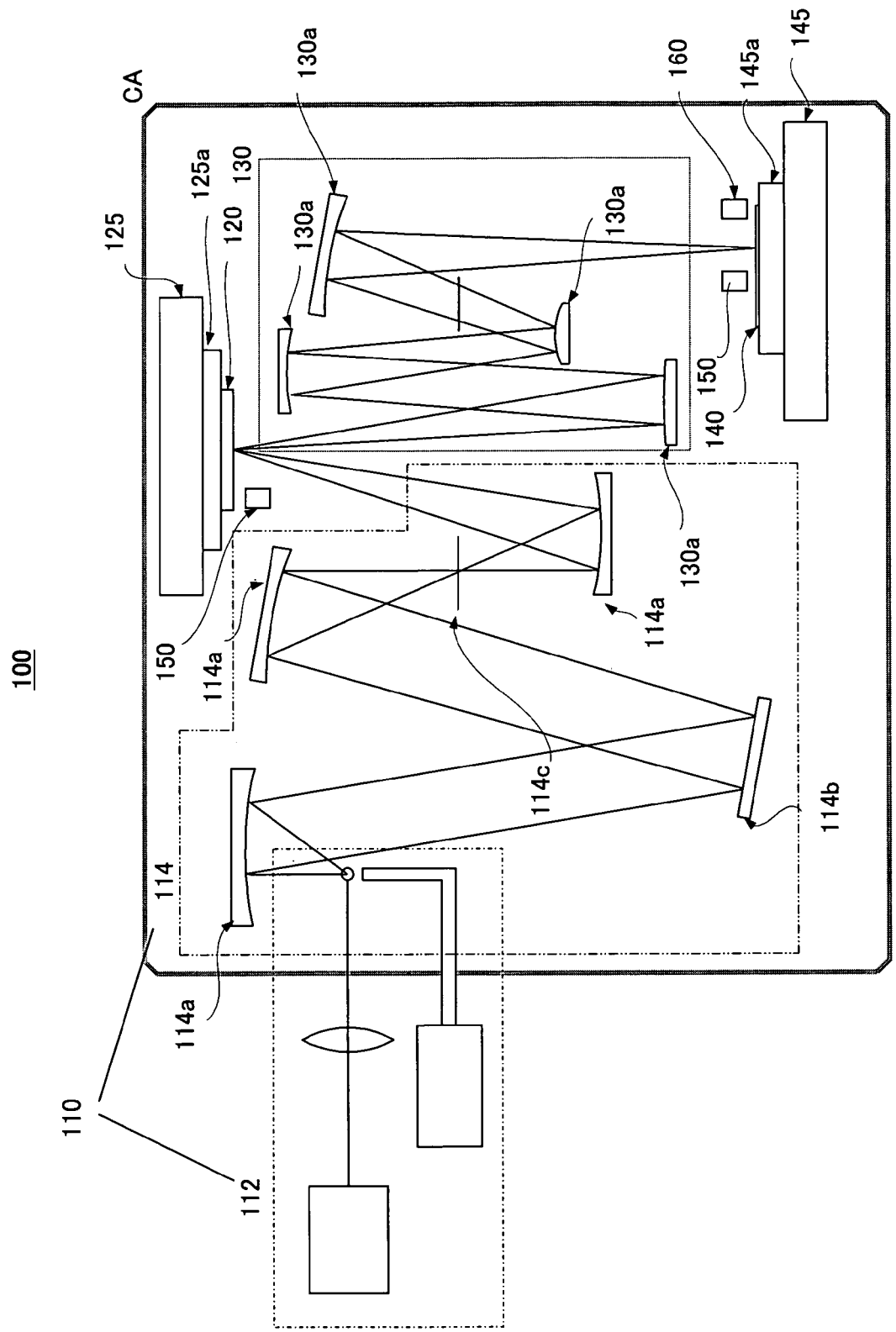
FIG. 1 is a schematic structure of an exposure apparatus of one embodiment according to the present invention.

A detailed description will now be given of an exposure apparatus 100 of one embodiment according to the present invention, with reference to accompanying drawings. In each figure, the same element is designated by the same reference numeral, and a description thereof will be omitted. Here, FIG. 1 is a schematic structure of the exposure apparatus 100.

The inventive exposure apparatus 100 is a projection exposure apparatus that uses, as illumination light for exposure, EUV light (e.g., with a wavelength of 13.4 nm) to perform a step-and-scan or step-and-repeat exposure that transfers a circuit pattern on a mask 120 onto a substrate 140 to be exposed. Such an exposure apparatus is suitably applicable to a lithography process below submicron or quarter-micron, and a description will be given below of this embodiment exemplarily using a step-and-scan exposure apparatus (which is also called "a scanner"). The step-and-scan manner, as used herein, is an exposure method that exposes a mask pattern onto a wafer by continuously scanning the wafer relative to the mask, and by moving, after a shot of exposure, the wafer stepwise to the next exposure area to be shot. The step-and-repeat manner is another mode of exposure method that moves a wafer stepwise to an exposure area for the next shot every shot of cell projection onto the wafer.

The exposure apparatus 100 includes, as shown in FIG. 1, an illumination apparatus 110 that illuminates a mask 120 that forms a circuit pattern, a mask stage 125 that mounts the mask 120, a projection optical system 130 that projects diffracted light from an illuminated mask pattern onto the object 140, an alignment detection mechanism 150, and a focus position detecting mechanism 160.

A mirror and a mask for reflecting the EUV light do not necessarily reflect all the EUV light, but absorb 30% of the exposure light. Thereby, their temperatures rise, and the mirror (or optical element) sometimes deforms. The exposure should be conducted in a steady state in which the mirror's temperature and shape are stabilized. Whether it is the steady state is determined by measuring the temperature of the mirror (or a mask), and by determining whether the mirror's temperature is within a predetermined temperature variance region (for example, within 0.2 degrees, more preferably within 0.1 degrees for a mirror closest to the wafer on the optical path) for a predetermined time period (for example, longer than 30 minutes or preferably one hour). Here, the predetermined temperature variance region differs according to mirrors, and it would be within 3 degrees, more preferably within 1 degree for a mirror in the projection optical system 130 closest to the reticle. Here, the temperature measurement can use known contact or non-contact thermometers.

As shown in FIG. 1, at least the optical path through which the EUV light travels (or the entire optical system) should preferably be maintained in a vacuum atmosphere, since the EUV light has low transmittance to the air and causes contaminations as a result of response to components of residual gas (or polymer organic gas).

The illumination apparatus 110 uses arc EUV light corresponding to an arc field in the projection optical system 130, to illuminate the mask 120, and includes an EUV light source 112 and an illumination optical system 114.

The EUV light source 112 uses, for example, a laser plasma light source. The laser plasma light source irradiates a highly intensified pulse laser beam to a target material put in vacuum, thus generating high-temperature plasma for use as EUV light with a wavelength of about 13.4 nm emitted from this. The target material may use a metallic thin film, inert gas, and droplets, etc. The pulse laser preferably has high repetitive frequency, e.g., usually several kHz, for increased average intensity of the emitted EUV light. Alternatively, the EUV light source 112 may use a discharge plasma light source. Of course, the EUV light source 112 is not limited to them, but may use any technology known in the art. The conventional exposure apparatus, even when using KrF laser as a light source, usually does not turn on and off the luminous (or emission) part of the light source.

The illumination optical system 114 includes a condenser mirror 114a and an optical integrator 114b. The condenser mirror 114a condenses EUV light that is radiated approximately isotropically from the laser plasma light source. The optical integrator 114b uniformly illuminates the mask 120 with a predetermined numerical aperture. The illumination optical system 114 further includes an aperture 114c at a position conjugate with the mask 120, which limits an illumination area of the mask 120 to an arc shape.

The mask 120 is a cataoptric reticle, and forms, on a mirror, a circuit pattern (or image) to be transferred. The mask 120 is supported and driven by a mask stage 125. The diffracted light emitted from the mask 120 is projected onto the object 140 after reflected by the projection optical system 130. The mask 120 and object 140 are arranged optically conjugate with each other. Since the exposure apparatus 200 of this embodiment is a scanner, the mask 120 and object 140 are scanned to project a pattern on the mask 120, onto the object 140.

The mask stage 125 supports the mask 120 via a reticle chuck 125a, and is connected to a moving mechanism (not shown). The mask stage 125 can use any structure known in the art. The moving mechanism (not shown) includes a linear motor, etc., and moves the mask 120 by driving the mask stage 125 at least in a direction X. The exposure apparatus 100 scans the mask 120 and the object 140 synchronously. The reticle chuck 125a is an electrostatic chuck, and absorbs the mask 120 by an electrostatic absorbing force. The reticle chuck 125a forms a channel, similar to a mirror holder 132, which will be described later, and cooled by coolant supplied through the channel, such as water and nitrogen gas. The cooling structure to the mask 120 and the reticle chuck 125a quickly leads to the steady temperature. Here, X is a scan direction on the mask 120 or the object 140, Y is a direction perpendicular to it, and Z is a perpendicular direction on the surface of mask 120 or the object 140.

The projection optical system 130 uses plural multilayer mirrors 130a to project a reduced size of a pattern formed on the mask 120 onto the object at an image surface. The number of mirrors is about four to six. For wide exposure area with the small number of mirrors, the mask 120 and object 140 are simultaneously scanned to transfer a wide area that is an arc-shaped area or ring field apart from the optical axis by a predetermined distance. The projection optical system 130 includes four mirrors 130a in the instant embodiment, and images a pattern on the mask 120 at a reduction of ¼.

The mirror 130a is formed by grinding and polishing a plate made of a rigid and hard material having a small coefficient of thermal expansion, such as low thermal expansion glass and SiC, so as to form a predetermined reflection surface shape, and by forming a multilayer film, such as molybdenum and silicon on a reflective surface. The mirror 130a has a concave or convex spherical or aspheric reflective surface with a numerical aperture ("NA") of about 0.1 to about 0.2.

Figure 2:
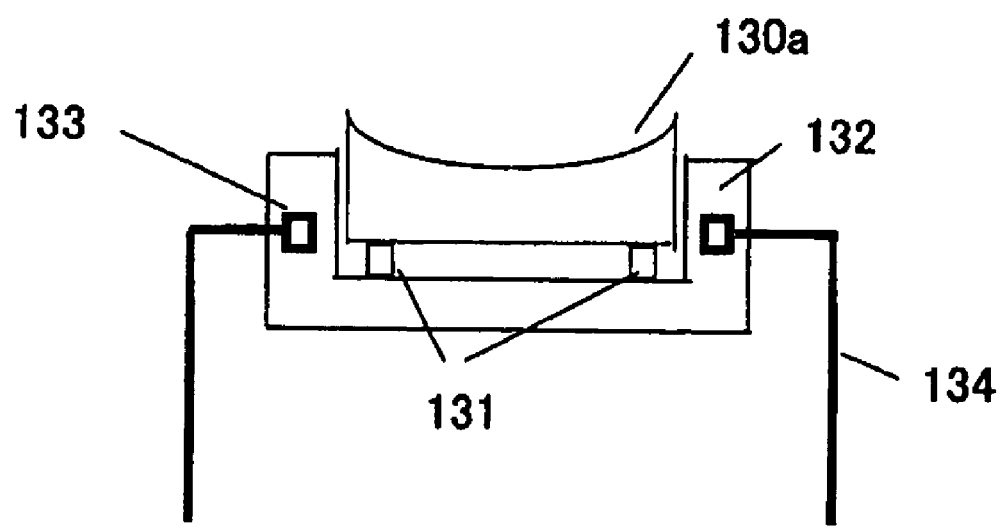
FIG. 2 is a schematic sectional view showing an exemplary mirror supported by a mirror holder.

The mirror 130a is supported, as shown in FIG. 2, on a mirror holder 132 via a piezo-electric actuator 131. An orientation of the mirror 130a is changed by driving the actuator 131. The mirror holder 132 forms a channel 133 therein, and is cooled by coolant, such as water and nitrogen gas, supplied by a pipe 134 connected to the channel 133. The coolant is supplied by a coolant circulator (not shown). The cooling structure to the mirror 130a and the mirror holder 132 quickly leads to the steady temperature. Alternatively, the mirror 130a and the mirror holder 132 may be cooled by radiation by arranging a cooling plate arranged opposite to and apart from the mirror 130a by a distance of about 30 cm. Here, FIG. 2 is a schematic sectional view showing one exemplary mirror 130a supported by the mirror holder 132.

The object 140 is an exemplary object to be exposed, such as a wafer and a LCD, and photoresist is applied to the object 140. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyldisilazane). The pre-bake treatment is a baking (or burning) step, softer than that after development, which removes the solvent.

The object 140 is supported by the wafer stage 145 through a wafer chuck 145a. The wafer stage 145 uses, for example, a linear motor to move the object 140 in X-Y-Z directions. The mask 120 and object 140 are, for example, scanned synchronously, and the positions of the mask stage 125 and wafer stage 145 are monitored, for example, by a laser interferometer and the like, so that both are driven at a constant speed ratio. The wafer stage 145a is placed on rough and fine movement stages and is a hyperbolic electrostatic chuck having two electrodes.

The alignment detection mechanism 150 measures positional relationships between the mask 120 and the optical axis of the projection optical system 130, and between the object 140 and the optical axis of the projection optical system 130, and sets positions and angles of the mask stage 125 and the wafer stage 145 so that a projected image of the mask 120 accords with a predetermined position on the object 140.

The focus position detection mechanism 160 measures a focus position of the object 140 in a direction Z, controls a position and an angle of the wafer stage 145, and always maintains a surface of the object 140 at an image position by the projection optical system 130 during exposure.

A mirror and a mask which reflect the EUV light do not necessarily reflect all the EUV light, but absorb 30% of exposure light. Thereby, their temperatures rise. A steady-state detecting mechanism detects the steady state by determining that a time change of the measured temperature of the mirror or mask is within a predetermined temperature variance region. Here, the temperature measurement can use known contact or non-contact thermometers.

Figure 3:
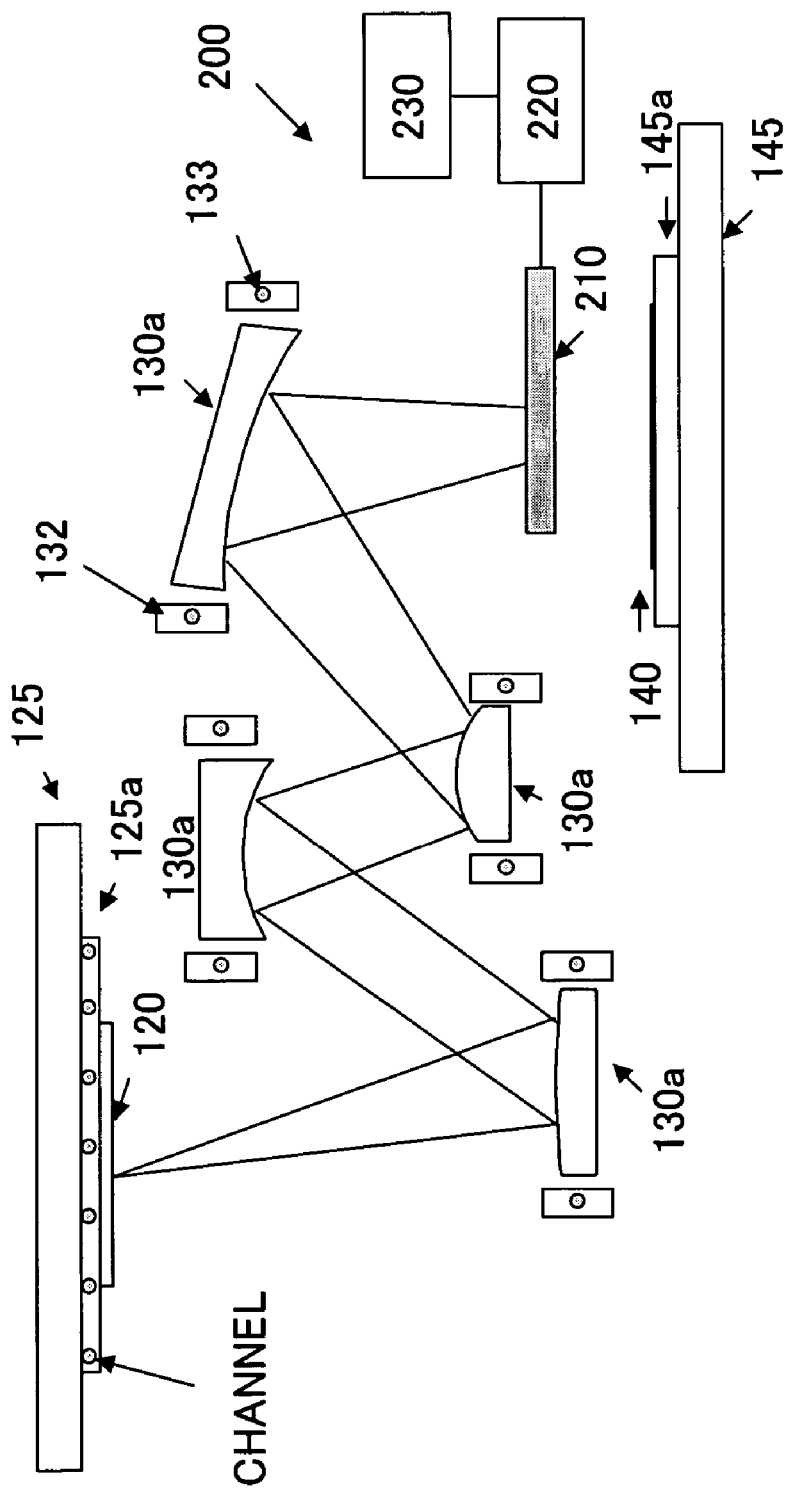
FIG. 3 is a schematic structure of an exemplary incidence control mechanism in the exposure apparatus shown in FIG. 1.

Here, a description will be given of an incidence control mechanism 200 as one characteristic structure in the exposure apparatus 100. FIG. 3 is a schematic structure showing one example of the incidence control mechanism 200 in the exposure apparatus 100. The incidence control mechanism 200 allows the EUV light from the EUV light source 112 to enter the wafer chuck 145a and object 140 when the object 140 is exposed, and prevents the EUV light from entering the wafer chuck 145a when the object 140 is not exposed. The incidence control mechanism 200 includes, as shown in FIG. 3, an absorption member 210, a drive mechanism 220, and a controller 230.

The absorption member 210 absorbs the EUV light, and made of relatively good heat-conductive and low radiant-power material, such as aluminum, copper and glass. Thereby, radiation-caused temperature rises of the neighboring mirror 130a and wafer chuck 145a are prevented as a result of that the absorption member 210 absorbs the exposure light and its temperature rises.

The drive mechanism 220 drives the absorption member between a first position on an optical path of the exposure light between the projection optical system 130 and the object 140 (more specifically between the projection optical system 130's mirror 130a closest to the object 140 and the wafer chuck 145a), and a second position apart from the optical path of the exposure light. The drive mechanism 220 can use any structure known in the art, and a description of its structure and operations will be omitted.

The controller 230 controls driving by the drive mechanism 220 so that the absorption member 210 absorbs the EUV light when the object 140 is not exposed. In other words, the controller 230 drives the absorption member 210 via the drive mechanism 220 to the second position when the object 140 is exposed, and to the first position when the object is not exposed.

The thus structured incidence control mechanism 200 enables the same heat to enter the condenser mirror 114a and optical integrator 114b in the illumination optical system 114, the mask 120 and the reticle chuck 125a, and the mirrors 130a in the projection optical system 130 at same positions like the exposure time, and thus heat these components similar to the exposure time. On the other hand, the heat does not enter the wafer chuck 145a similar to the exposure time, whereby its temperature distributions become similar between the exposure time and the non-exposure time. In this case, when the mask 120 is scanned similar to the exposure time, the mask 120 and the reticle chuck 125a can equalize the temperature distributions between the exposure time and the non-exposure time.

When the power of the exposure light incident upon the projection optical system 130 is smaller than the power of the exposure light incident upon the illumination optical system 110, the time period from the incidence of the exposure light to the steady state is short or negligible in the projection optical system or the incident exposure light has such small power that a state variance is so small that the non-steady state can be substantially considered to be the steady state. Therefore, the exposure light does not have to be irradiated onto the projection optical system 130 before substantial exposure and/or between substantial exposures. Rather, it is undesirable to irradiate the exposure light onto the projection optical system 130 because a material that absorbs the exposure light, such as carbon, adheres to a mirror surface (or reflective surface). On the other hand, the exposure light incident upon the illumination optical system has large power, the time period from the incidence of the exposure light to the steady state is so long that there can be differences (in optical performance, optical characteristic, reflectance, etc.) between the non-steady state and the steady state. Therefore, the exposure light is preferably irradiated onto the projection optical system 130 before substantial exposure and/or between substantial exposures. Accordingly, the exposure light is introduced only to the illumination optical system 114 that receives large incidence power and requires a long time for the steady state within a permissible range. In that case, the absorption member 210 is arranged to absorb the exposure light incident upon the mask 120 and the projection optical system 130.

Thus, the incidence control mechanism 200 can prevent great temperature rises in the mask 120 and the mirrors 130a in the projection optical system 130 as exposure starts, which cause thermal strains and resultant positional offsets and aberration at the beginning of the exposure.

Figure 4:
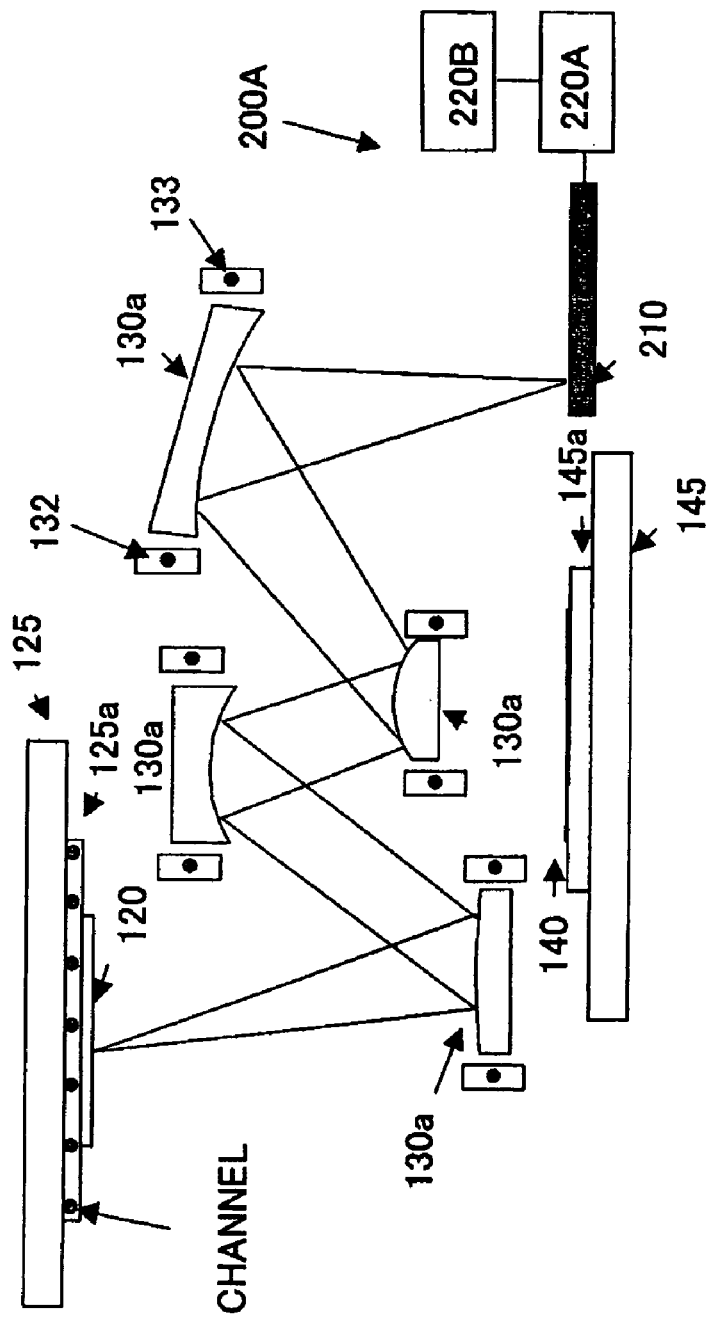
FIG. 4 is a schematic structure showing a variation of the incidence control mechanism shown in FIG. 3.

Referring now to FIG. 4, a description will be given of the incidence control mechanism 200A as a variation of the incidence control mechanism 200. FIG. 4 is a schematic structure of the incidence control structure 200A. The incidence control mechanism 200A includes, as shown in FIG. 4, the absorption member 210, a drive mechanism 220A, and a controller 230. The wafer stage 145 is configured to move the wafer chuck 145a to a position apart from the optical path of the EUV light guided by the projection optical system 130. In other words, the wafer chuck 145a and the object 140 absorbed by the wafer chuck 145a can be moved from an image position of the projection optical system 130.

The drive mechanism 220A is controlled by the controller 230, as described later, and moves the absorption member 210 to a position between the projection optical system 130 and the object 140 on the optical path of the exposure light (more specifically between the projection optical system 130's mirror 130a closest to the object 140 and the wafer chuck 145a) so that the absorption member 210 can absorb the EUV light when the object is not exposed. The drive mechanism 220A drives the absorption member 210 to a position of the wafer chuck 145a in the instant embodiment.

The controller 230 controls the wafer stage 145 so as to prevent the exposure light from entering the wafer chuck 145a when the object 140 is not exposed. The controller 230 controls driving by the drive mechanism 220A so that the absorption member 210 can absorb the EUV light when the object 140 is not exposed. In other words, the controller 230 drives the absorption member 210 via a moving mechanism of a wafer stage 145 to retreat the wafer stage 145 to a position apart from the optical path of the exposure light guided by the projection optical system 130, and to move the absorption member 210 via the drive mechanism 220 to a position on the optical path of the exposure light guided by the projection optical system 130.

Similar to the incidence control mechanism 200, the thus structured incidence control mechanism 200A enables the same heat to enter the condenser mirror 114a and optical integrator 114b in the illumination optical system 114, the mask 120 and the reticle chuck 125a, and the mirrors 130a in the projection optical system 130 at same positions like the exposure time, and thus heat these components similar to the exposure time. On the other hand, the heat does not enter the wafer chuck 145a similar to the exposure time, whereby its temperature distributions become similar between the exposure time and the non-exposure time.

Since the illumination optical system 114, the mask 120, the projection optical system 130 and the wafer chuck 145a can maintain their temperatures and thus thermal strains almost constant when exposure starts from the standby time, the transfer precision can be prevented from deteriorating.

The instant embodiment eliminates a limitation on an arrangement of the absorption member 210 and facilitates the maintenance, such as a small interval between the projection optical system 130's mirror 130a closest to the object 140 and the object 140. In addition, the instant embodiment does not require a complex structure of the incidence control mechanism 200A and thus has an effect of cost reduction.

In the non-exposure or standby time, the EUV light emitted from the EUV light source 112 is introduced to at least part of the optical elements in the illumination optical system 114, the mask 120, and the projection optical system 130. In this case, the absorption member 210 in the incidence control mechanism 200 or a retreated wafer chuck 145a by the wafer stage 145 in the incidence control mechanism 200A shield the wafer chuck 145a from the EUV light.

Then, the controller 230 determined whether the optical elements in the illumination optical system 114, the mask 120, and the projection optical system 130 have a steady temperature distribution. The temperature distribution is a temperature difference between the center and the peripherals. The steady state is detected as discussed above. The controller 230 maintains the standby state, when determining that the optical element does not have the steady state, so as to prevent the temperature of the wafer chuck 145a from rising due to the EUV light. The controller 230 terminates the standby state when the optical element has the steady temperature distribution. Thus, the controller 230 removes the absorption member 210 in the incidence control mechanism 200 from the optical path of the EUV light or returning the wafer chuck 145a on the optical path of the EUV light for the incidence control mechanism 200A, and allows the EUV light to enter the object 140. The instant embodiment uses an arc or ring image surface to expose the entire surface of the mask 120 by scanning the mask 120 and the object 140 at speed ratio corresponding to a reduction ratio.

Figure 5:
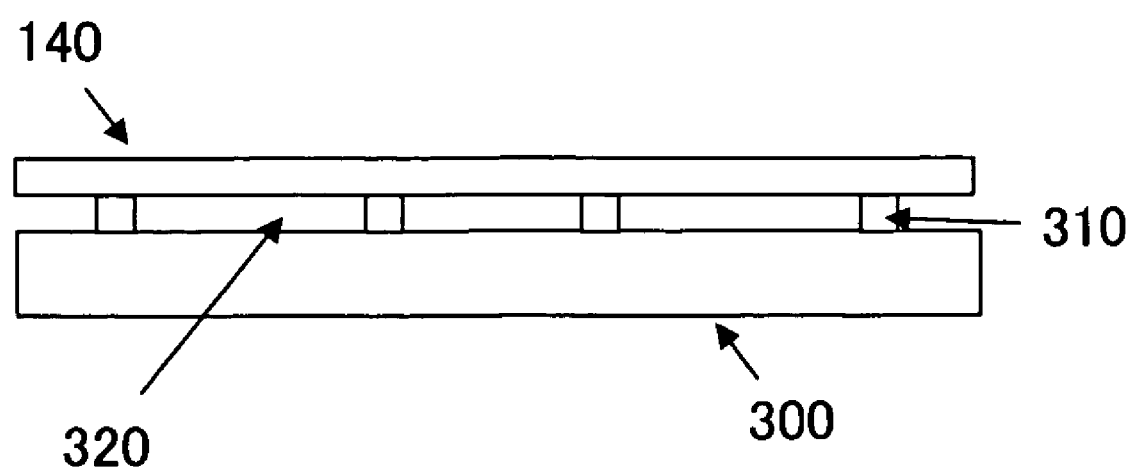
FIG. 5 is a schematic sectional view of a wafer chuck of one embodiment according to the present invention.

A wafer chuck 300 shown in FIG. 5 can equalize the temperature distributions of an optical element in the exposure apparatus 100 between the exposure time and the non-exposure time, and improves effects of the incidence control mechanisms 200 and 200A. Here, FIG. 5 is a schematic sectional view of the wafer chuck 300 of one embodiment according to the present invention. The wafer chuck 300 has two electrodes (not shown), and absorbs the object 140 through an electrostatic absorption force.

The wafer chuck 300 has, as shown in FIG. 5, a projection 310 that contacts and absorbs the object 140, and a concave that does not contact the object 140. The instant embodiment maintains a contact ratio to be 20% or smaller between the projection 310 and the object 140 or a ratio of the projection 310 to the entire surface that sums up the projection 310 and the concave 320 on the wafer chuck 300. Thereby, the thermal resistance increases between the wafer chuck 300 and the object 140, to prevent the temperature from easily transmitting to the wafer chuck 300, in particular, under the vacuum or reduced pressure atmosphere. A smaller contact ratio prevents the temperature propagation from the object 140 to the chuck 300, but an excessively small contact area leads to the insufficient absorption force. Such an absorption force may be too small to accelerate or decelerate the object 140 during the exposure. Therefore, the instant embodiment sets the contact ratio to be about 20%, but the contact ratio smaller than 20% is viable from the improving absorption force by the electrostatic chuck.

When the object 140 is exposed, the wafer chuck 300 can prevent its temperature rise. When the object 140 is not exposed, the wafer chuck 300 does not cause the temperature rise since the exposure light seldom enters the wafer chuck 300. Since the illumination optical system 114, the mask 120, the projection optical system 130 and the wafer chuck 300 can maintain their temperatures and thus thermal strains almost constant when exposure starts from the standby time, the transfer precision can be prevented from deteriorating.

Figure 6:
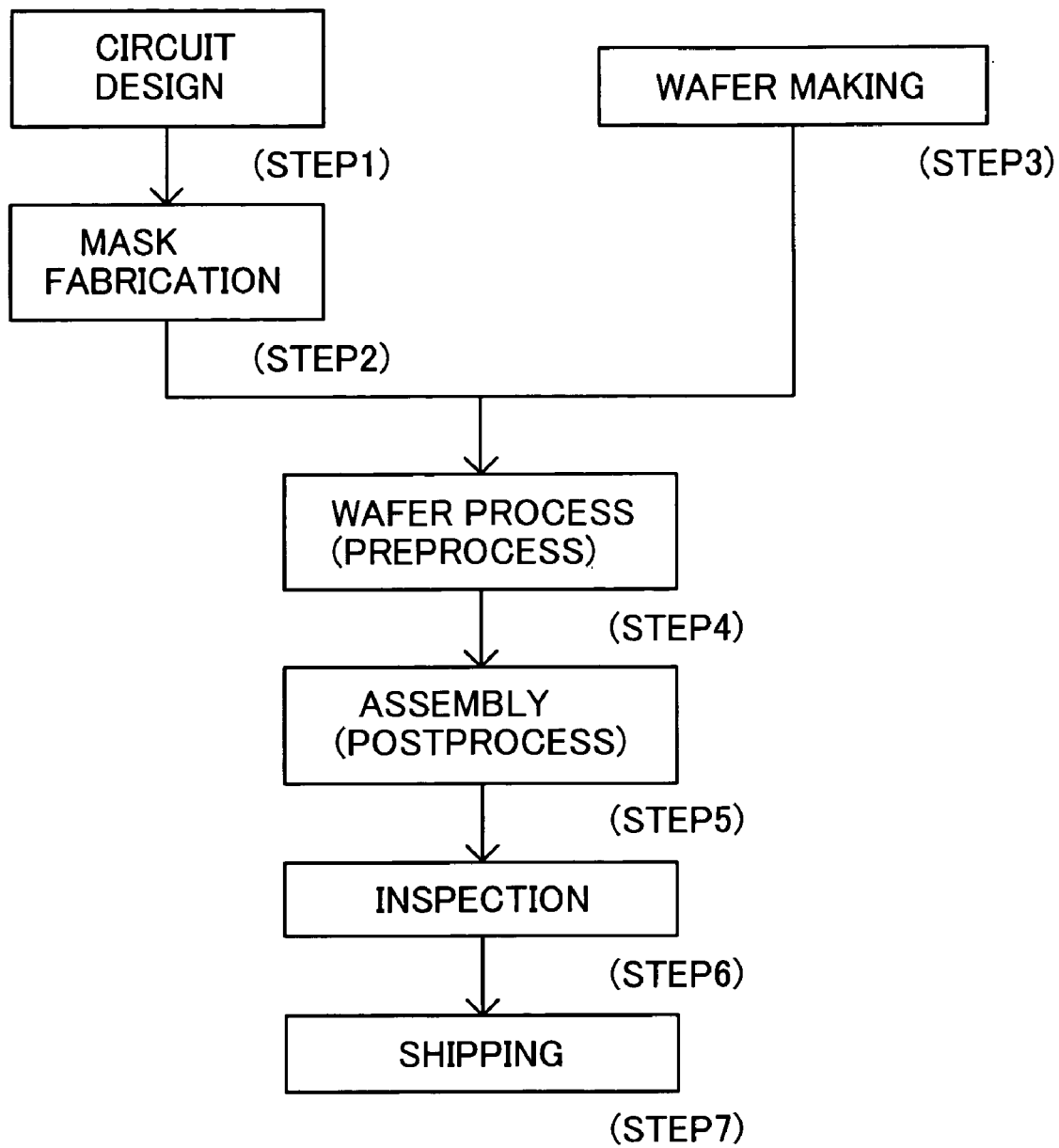
FIG. 6 is a flowchart for explaining how to fabricate devices (such as semiconductor chips such as ICs and LSIs, LCDs, CCDs, and the like).
Figure 7:
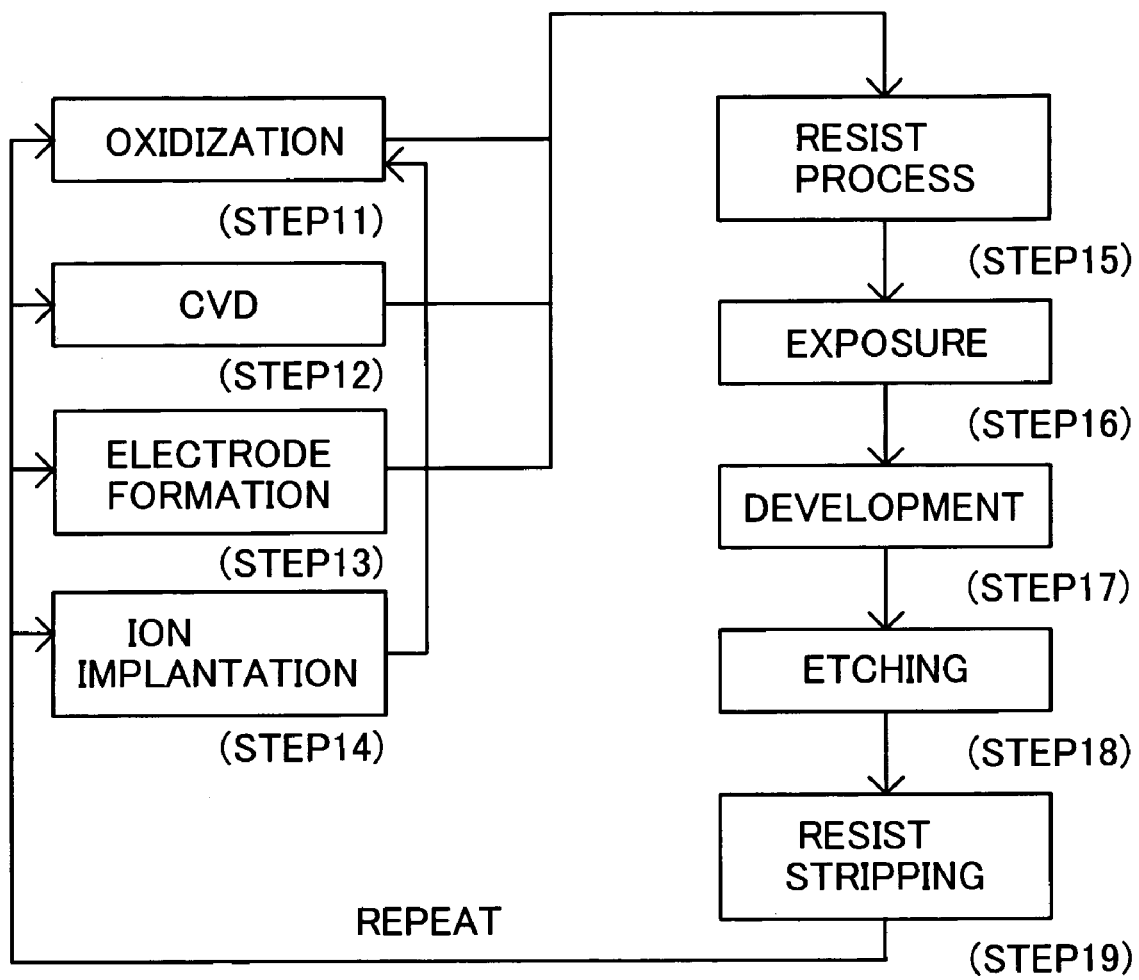
FIG. 7 is a flowchart for Step 4 that is a wafer process shown in FIG. 6.

Referring to FIGS. 6 and 7, a description will now be given of an embodiment of a device fabricating method using the above mentioned exposure apparatus 100. FIG. 6 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 7 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 100 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of the instant embodiment may manufacture higher quality devices than the prior art. In this manner, the device fabricating method that uses such an exposure apparatus 100 and the device as a final product serve as other aspects according to the present invention.

Further, the present invention is not limited to these preferred embodiments, but various modifications and variations may be made without departing from the spirit and scope of the present invention. For example, the present invention is applicable not only to an EUV exposure apparatus, but also such exposure apparatuses as an EB exposure apparatus and an exposure apparatus that has an equal magnification and uses SR as a light source.

Thus present embodiments may provide an illumination system that is not easily affected by light source fluctuation while decreasing the number of optical members in a lithography using the EUV light. This stabilizes baking pattern's property, and improves a remarkable yield in a device manufacturing step. An optical system of fewer members increases its light utilization efficiency, and higher illuminance on a wafer with a light source of the same power, thus drastically improving device mass production.

This invention can provide an exposure apparatus that almost equalizes temperature distributions of its element between the exposure time and the non-exposure time for maintained resolution and improved throughput.

What is claimed is:

1. An exposure apparatus having an exposure mode that transfers a pattern on a reticle onto an object, and a standby mode that waits for exposure, said exposure apparatus comprising:
    an optical system having plural optical elements, for introducing the exposure light to the object in the exposure mode; and
    a mechanism for allowing the exposure light to enter the reticle and all of the plural optical elements in the standby mode, and for preventing the exposure light from entering the object in the standby mode.

2. An exposure apparatus according to claim 1, further comprising a light source that emits the exposure light in the standby mode.

3. An exposure apparatus according to claim 1, wherein the exposure light is extreme ultraviolet light having a wavelength of 20 nm or less.

4. An exposure apparatus according to claim 1, wherein said mechanism includes:
    an absorption member that absorbs the exposure light;
    a drive mechanism for driving said absorption member between a first position on an optical path of the exposure light, and a second position apart from the optical path of the exposure light; and
    a controller for controlling driving by said drive mechanism so that the absorption member absorbs the exposure light in the standby mode.

5. An exposure apparatus according to claim 4, further comprising a projection optical system for projecting the pattern onto the object, and wherein the first position is located between said projection optical system and the object.

6. An exposure apparatus according to claim 1, further comprising a stage for movably supporting the object, wherein said mechanism includes a drive mechanism for driving the stage to move the object to a position apart from an optical path of the exposure light.

7. An exposure apparatus according to claim 6, wherein said mechanism further includes:
    an absorption member that absorbs the exposure light, said absorption member being driven by said drive mechanism between a first position on an optical path of the exposure light, and a second position apart from the optical path of the exposure light; and
    a controller for controlling driving by said drive mechanism so that the absorption member absorbs the exposure light in the standby mode.

8. A standby method for waiting for exposure that transfers a pattern on a reticle onto an object absorbed by a wafer chuck through exposure light and an optical system, said method comprising the steps of:
    irradiating the exposure light to the reticle and all of optical elements included in the optical system; and
    shielding the object from the exposure light during said irradiating step.

9. A method according to claim 8, wherein an optical path of the light is maintained in an atmosphere under vacuum or reduced pressure.

10. An exposure method that illuminates a pattern formed on a reticle and transfers the pattern onto an object absorbed by a wafer chuck through an optical system that includes an optical element said step comprising the steps of:
    determining whether temperatures of the reticle and all of optical elements included in the optical system are in steady states; and
    irradiating the exposure light onto the reticle and all of optical elements included in the optical system while preventing the exposure light from entering the object, when said determining step determines that the temperature distributions are not in the steady states.

11. A device fabrication method comprising the steps of:
    exposing an object with by using an exposure apparatus; and developing the object that has been exposed,
    wherein the exposure apparatus has an exposure mode that transfers a pattern on a reticle onto die object, and a standby mode that waits for exposure, said exposure apparatus including:
    an optical system having plural optical elements, for introducing the exposure light to the object in the exposure mode; and
    a mechanism for allowing the exposure light to enter the reticle and all of the plural optical elements in the standby mode, and for preventing the exposure light from entering the object in the standby mode.

* * * * *